(12) United States Patent
Park

(10) Patent No.: US 6,578,588 B2
(45) Date of Patent: Jun. 17, 2003

(54) UNIFIED STRIP/CLEANING APPARATUS

(75) Inventor: Il Ryong Park, Kumi-shi (KR)

(73) Assignee: LG.Phillips LCD Co., Ltd., Seoul (KR)

( * ) Notice: Subject to any disclaimer, the term of this patent is extended or adjusted under 35 U.S.C. 154(b) by 71 days.

(21) Appl. No.: 09/749,575

(22) Filed: Dec. 28, 2000

(65) Prior Publication Data
US 2002/0092548 A1 Jul. 18, 2002

(30) Foreign Application Priority Data
Dec. 30, 1999 (KR) .............................. 99-66038

(51) Int. Cl.$^7$ ................................................ B08B 3/00
(52) U.S. Cl. ...................... 134/61; 134/902; 156/345.22
(58) Field of Search ............................. 134/61, 66, 902; 156/345.2, 345.22

(56) References Cited

U.S. PATENT DOCUMENTS

| 5,177,514 A | * | 1/1993 | Ushijima et al. ......... 134/66 X |
| 5,568,821 A | * | 10/1996 | Ohmori et al. .......... 134/902 X |
| 5,701,627 A | * | 12/1997 | Matsumura et al. ...... 134/61 X |
| 6,230,721 B1 | * | 5/2001 | Miyasako .................... 134/61 |

* cited by examiner

Primary Examiner—Philip R. Coe
(74) Attorney, Agent, or Firm—Birch, Stewart, Kolasch & Birch, LLP

(57) ABSTRACT

A unified strip/cleaning apparatus wherein a strip device is integrated with a cleaning device. In the apparatus, a strip line removes resin on a substrate and a cleaning line is provided under the strip line to clean and dry the substrate. A loader supplies the substrate to the strip line, and an unloader receives the substrate from the cleaning line. Accordingly, the installation space can be minimized.

8 Claims, 3 Drawing Sheets

UNIFIED STRIP/CLEANING APPARATUS

BACKGROUND OF THE INVENTION

1. Field of the Invention

The present invention relates to an apparatus of fabricating a liquid crystal display, and more particularly to a unified strip/cleaning apparatus wherein a strip device is unified with a cleaning device.

2. Description of the Related Art

Generally, since a liquid crystal display (LCD) has the advantages of small size, thin thickness and low power consumption, it has been used for a notebook personal computer, office automation equipment and audio/video equipment, etc. Particularly, an active matrix LCD using thin film transistors (TFT's) as switching devices is suitable for displaying a dynamic image.

An active matrix LCD displays a picture corresponding to a video signal such as a television signal on a picture element or pixel matrix having pixels arranged at each intersection between gate lines and data lines. Each pixel includes a liquid crystal cell controlling a transmitted light amount in accordance with a voltage level of a data signal from the data line. The TFT is installed at each intersection between the gate lines and the data lines to switch the data signal to be transmitted to the liquid crystal cell in response to a scanning signal from the gate line.

FIG. 1 shows a TFT formed on a substrate 18. A process of fabricating the TFT will be described below. First, a gate electrode 20 and a gate line is deposited on the substrate 18 with a metal such as Al, Mo, Cr or their alloy, etc. and thereafter is patterned by the photolithography. A gate insulating film 22 made from an organic material such as $SiN_x$ or $SiO_x$, etc. is deposited on the substrate 18 provided with the gate electrode 20. Then, a semiconductor layer 24 made from an amorphous silicon (a-Si) layer and an ohmic contact layer 26 made from an a-Si doped with n+ ions are continuously deposited on the gate insulating film 22. A source electrode 28 and a drain electrode 30 made from a metal such as Mo or Cr, etc. are formed on the ohmic contact layer 26. The source electrode 28 is patterned integrally with the data line. The ohmic contact layer 26 exposed through an opening between the source electrode 28 and the drain electrode 30 is eliminated by dry etching or wet etching. A protective film 32 made from $SiN_x$ or $SiO_x$ is entirely deposited on the substrate 18 to cover the TFT. Subsequently, a contact hole is formed in the protective film 32. A pixel electrode 34 made from an indium tin oxide (ITO) is coated so as to be connected, via the contact hole, to the drain electrode 30. Such a TFT fabricating process includes a photoresist pattern formation step, an etching step and a photoresist pattern strip step, etc. upon the patterning of the electrode layers 20, 28 and 30 or upon the formation of the contact hole.

FIG. 2 shows a conventional strip and cleaning apparatus. Referring to FIG. 2, the conventional strip and cleaning apparatus includes a loader 40 for loading a cassette (not shown) received with a substrate, a strip line for removing a photo-resistor (PR) of the substrate transported from the cassette, a cleaning line for cleaning the stripped substrate, a dry module 54 for drying the substrate cleaned by means of the cleaning line, and a unloader 56 for loading the substrate dried by means of the dry module 54 into the cassette that is arranged in an inline type. The loader 40 carries the substrate received in the cassette (not shown) into a first strip module 42 using a conveyor or a robot. The substrate from the loader 40 in which the PR formed on the TFT is removed by a pipe shower at the first strip module, is conveyed into a second strip module 44. A stripper made from a mixture of $H_3PO_4$, $CH_3COOH$ and $HNO_3$ is used to remove the PR on the substrate. The second strip module 44 removes residual PR film that has not been removed at the first strip module 42 using a brush. The substrate having the PR film removed by physical cleaning is carried into a third strip module 46. The third strip module 46 injects the stripper at a high pressure by a cavitation jet (CJ) system to remove the residual PR film on the substrate that has not been removed at the first and second strip modules 42 and 44. The substrate stripped at the third strip module 46 is carried into an isopropyl alcohol (IPA) injecting module 48. The IPA injecting module 48 removes minute alien substances and cleans the stripper using an IPA liquid. If the stripper and de-ionized water are mixed at a specific composition ratio, OH is produced to corrode aluminum (Al) formed on the surfaces of the source, drain and gate electrodes. Thus, the stripper is diluted with the IPA liquid so as to prevent the corrosion of aluminum. The substrate cleaned with the IPA liquid by means of the IPA injecting module 48 is carried into a first cleaning module 50. The first cleaning module 50 cleans the substrate by a pipe shower using de-ionized water and thereafter carries it into a second cleaning module 52. The second cleaning module 52 injects de-ionized water at a high pressure by the CJ system to clean the substrate. The substrate cleaned at the second cleaning module 52 is carried into a dry module 54. The dry module 54 rotates the substrate using a centrifugal force of 1800 to 2200 rpm to remove the de-ionized water. The substrate dried at the dry module is received into the cassette on the unloader 56.

Such conventional strip/cleaning equipment requires a wide installation space of 10840×1800 mm.

SUMMARY OF THE INVENTION

Accordingly, it is an object of the present invention to provide a unified strip/cleaning apparatus wherein a strip line is integrated with a cleaning line to minimize the installation space.

In order to achieve these and other objects of the invention, a unified strip/cleaning apparatus according to an embodiment of the present invention includes a strip line for removing resin on a substrate; and a cleaning line provided under the strip line to clean and dry the substrate.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1:
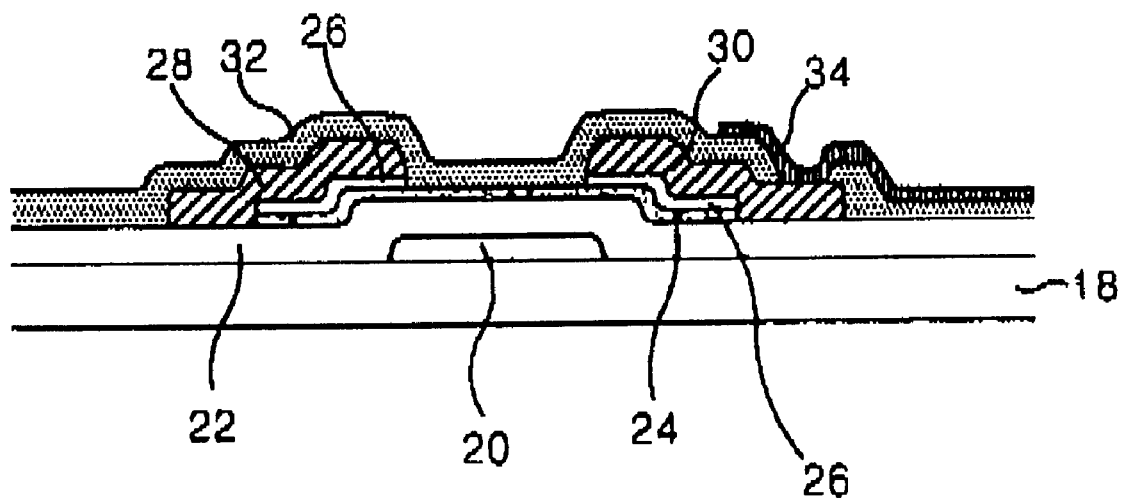
FIG. 1 is a section view showing the structure of a conventional thin film transistor.
Figure 2:
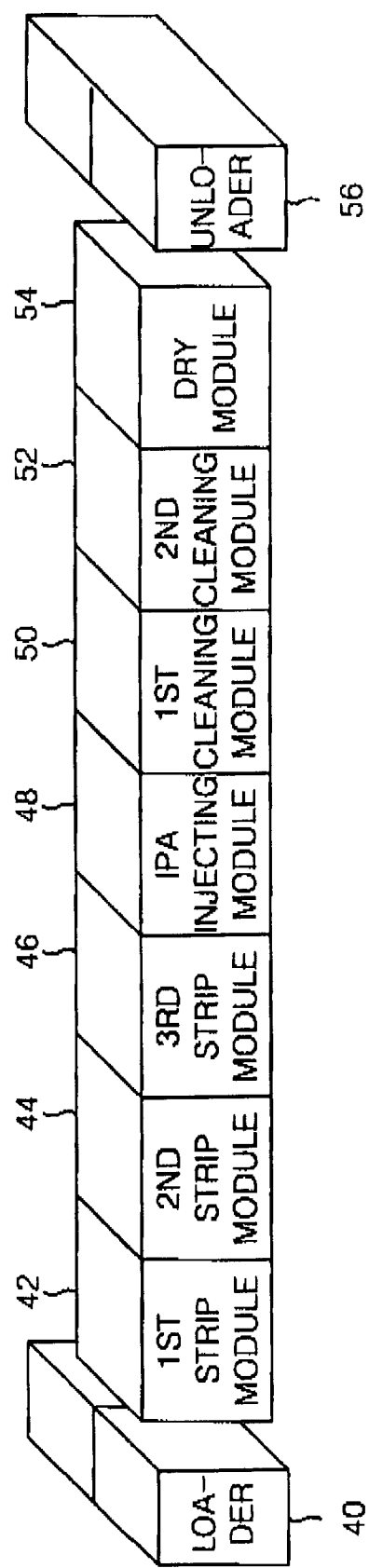
FIG. 2 is a block diagram showing the configuration of a conventional strip and cleaning apparatus.
Figure 3:
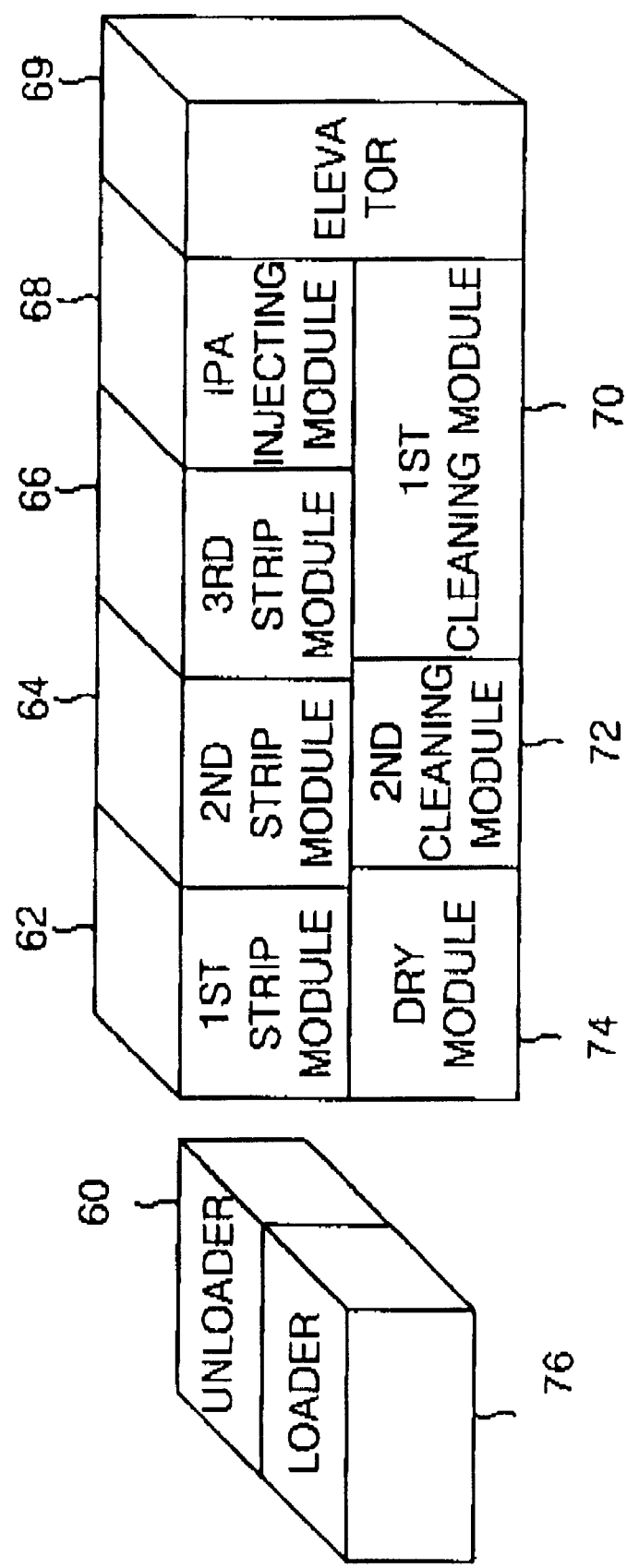
FIG. 3 is a block diagram showing the configuration of a unified strip/cleaning apparatus according to an embodiment of the present invention.

Referring to FIG. 3, there is shown a unified strip/cleaning apparatus according to an embodiment of the present invention in which a strip line and a cleaning line are stacked in a two-layer configuration. The present strip/cleaning apparatus includes a loader 76 for loading a cassette (not shown) received with a substrate, a strip line for removing a photoresist (PR) on the substrate transported from the cassette, a cleaning line for cleaning the stripped substrate, a dry module 74 for drying the substrate cleaned by means of the cleaning line, and an unloader 60 for loading the substrate dried by means of the dry module 54 into the cassette. The loader 76 is mounted with a desired number of cassettes, each of which is received with a plurality of substrates. The loader 76 plays the role of carrying the substrates received in the cassette (not shown) into a first strip module 62 using a conveyor or a robot. The substrate carried from the loader 76 into the first strip module 62, where the PR formed on the TFT is removed by a pipe shower, is then conveyed into a second strip module 64. Then, the substrate having the PR film further removed by the physical cleaning process is carried into a third strip module 66. The third strip module 66 injects a stripper at a high pressure by a cavitation jet (CJ) system to remove residual PR film on the substrate that has not been previously removed at the first and second strip modules 62 and 64. The substrate stripped at the third strip module 66 is carried into an isopropyl alcohol (IPA) injecting module 68. The IPA injecting module 68 removes minute alien substances and cleans the stripper using an IPA liquid. The substrate cleaned with the IPA liquid by means of the IPA injecting module 68 is conveyed, via an elevator 69, into a first cleaning module 70. The first cleaning module 70 cleans the substrate by a pipe shower using de-ionized water and thereafter carries it into a second cleaning module 72. The second cleaning module 72 injects de-ionized water at a high pressure utilizing the CJ system to clean the substrate. The substrate cleaned at the second cleaning module 72 is carried into a dry module 74. The substrate cleaned at the second cleaning module 72 is carried into a dry module 74. The substrate conveyed into the dry module 74 is rotated by a centrifugal force of 1800 to 2200 rpm to remove the de-ionized water. The substrate dried at the dry module 74 is received into the cassette on the unloader 60.

As described above, the unified strip/cleaning apparatus according to the present invention is stacked to have a two-layer structure, so that the installation space can be minimized. Accordingly, the present unified strip/cleaning apparatus occupies a space of 5270×1800 mm that is equal to one-half of the space utilized in the prior art.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention.

What is claimed is:

1. A unified strip/cleaning apparatus, comprising:
   a strip line for removing a resin on a substrate; and
   a cleaning line disposed below the strip line to clean and dry the substrate; and
   an elevator arranged to directly convey the substrate from the strip line to the cleaning line.

2. The strip/cleaning apparatus of claim 1, wherein:
   an isopropyl alcohol (IPA) injecting module is provided in the strip line to remove a stripper injected for removing the resin.

3. The strip/cleaning apparatus of claim 2, wherein:
   an elevator is provided for conveying the substrate carried from the IPA injecting module into the cleaning line disposed therebelow.

4. The strip/cleaning apparatus as claimed in claim 3, wherein said cleaning line includes:
   a first cleaning module for supplying a cleaning liquid onto the substrate received from the elevator to primarily clean the substrate utilizing a pipe shower;
   a second cleaning module for injecting the cleaning liquid onto the substrate at a high pressure to secondarily clean the substrate; and
   a dry module for drying the substrate having a residual cleaning liquid.

5. The strip/cleaning apparatus of claim 1, wherein:
   a loader is provided for supplying the substrate to the strip line; and
   an unloader is provided directly below the loader for receiving the substrate from the cleaning line.

6. The strip/cleaning apparatus as claimed in claim 1, wherein said strip line includes:
   a first strip module for supplying a stripper to the substrate received from the loader to primarily remove the resin from the substrate;
   a second strip module for secondarily and physically removing the resin; and
   a third strip module for injecting the stripper onto the substrate at a high pressure to completely remove residual resin on the substrate.

7. The strip cleaning apparatus of claim 1, which has an installation space of less than about 10,840×1,800 mm.

8. The strip cleaning apparatus of claim 1, which has an installation space of about 5,270×1,800 mm.

* * * * *